INVENTORS
ROSS N. TUCKER
MICHAEL L. BARRY

INVENTORS:
ROSS N. TUCKER
MICHAEL L. BARRY

INVENTORS:
ROSS N. TUCKER
MICHAEL L. BARRY

United States Patent Office 3,736,193
Patented May 29, 1973

3,736,193

SINGLE CRYSTAL-POLYCRYSTALLINE PROCESS FOR ELECTRICAL ISOLATION IN INTEGRATED CIRCUITS

Ross N. Tucker, Menlo Park, and Michael L. Barry, Palo Alto, Calif., assignors to Fairchild Camera and Instrument Corporation, Mountain View, Calif.

Original application July 29, 1969, Ser. No. 845,822, now abandoned. Divided and this application Oct. 26, 1970, Ser. No. 84,096

Int. Cl. H01l *7/36, 19/00, 5/00*

U.S. Cl. 148—175 12 Claims

ABSTRACT OF THE DISCLOSURE

A semiconductor wafer, suitable for use in forming integrated circuits, contains, on a substrate, islands of single crystal silicon of one conductivity type, each island being isolated from adjacent islands by walls of polycrystalline silicon of opposite conductivity type. Polycrystalline silicon pipes in the single crystal silicon provide controlled resistance contacts from the top surface of the single crystal silicon to buried collector layers underlying the single crystal silicon.

CROSS-REFERENCE TO ANOTHER APPLICATION

This is a division of application Ser. No. 845,822, filed July 29, 1969, now abandoned.

BACKGROUND OF THE INVENTION

Field of the invention

This invention relates to integrated circuits and in particular to both a method of forming PN isolation junctions in such circuits and the resulting structure. The method of this invention reduces both the number of process steps necessary to produce an integrated circuit, and the proportion of the surface area of the integrated circuit consumed by isolation regions.

Prior art

An integrated circuit consists of a plurality of active devices, such as transistors or diodes, formed in a single layer of semiconductor material and interconnected by conductive paths containing passive elements, such as resistors and capacitors, either formed in, or on top of, the semiconductor layer. The semiconductor layer is usually formed on, and supported by, a substrate which may be a semiconductor material of opposite conductivity type to that of the layer, or an insulating material.

Each active element, or group of active elements, in an integrated circuit must be electrically isolated from the other active elements, in the circuit. This can be done by one of several methods. Usually a selectively shaped region of conductivity type opposite to the conductivity type of the semiconductor layer is formed by diffusing an impurity through the film to the substrate underlying the layer. When the PN junctions between this diffused region and the remainder of the layer are back biased, the active element or elements surrounded by this diffused region and the underlying substrate are electrically isolated from adjacent active elements. A second method of isolating each active element is to etch through the semiconductor layer to the support substrate to form moats around each active element or group of active elements. These moats are then either filled with insulating material or left empty.

Both of these techniques consume a large proportion of the surface area of the semiconductor film in which the integrated circuit is formed. Accordingly, these techniques lower the "packing density" of the circuit; that is, these techniques lower the average number of active devices per unit of layer surface area. Furthermore, the use of diffused isolation regions involves high-temperature isolation diffusion, an expensive, time-consuming process.

SUMMARY OF THE INVENTION

This invention, on the other hand, overcomes these disadvantages of the prior art isolation techniques. The isolation technique of this invention yields an integrated circuit with a very high packing density and eliminates lengthy high-temperature isolation diffusions. Furthermore, the technique of this invention can be adapted to provide low resistance paths from the top-side collector contact to a buried collector layer.

According to this invention, active devices in integrated circuits are electrically isolated from each other by first depositing on the underlying support substrate an oxide pattern in the shape of the isolation pattern desired in the semiconductor layer. This oxide is doped to a desired concentration with a selected impurity, either N or P-type. Next, the substrate is placed in an epitaxial reactor and silicon, doped lightly with an impurity of a type opposite to that in the oxide, is deposited over the top surface of the support substrate. The silicon deposited directly on the support substrate grows epitaxially to form single crystal silicon while the silicon deposited on the oxide forms polycrystalline silicon, so-called "polysilicon." The deposition continues until semiconductor material of selected thickness has been grown on the support substrate.

However, during the silicon deposition, the impurity contained in the oxide grid diffuses from the oxide into both the polycrystalline and single crystal silicon. Because the diffusion rate or "diffusivity" of an impurity in polycrystalline silicon is many times higher than the diffusivity of the same impurity in single crystal silicon, the diffusant contained in the oxide grid moves mainly into the polycrystalline silicon. Although the polycrystalline silicon initially is lightly doped with an impurity of a type opposite to the impurity in the oxide, the much higher concentration of the impurity in the oxide soon reverses the polysilicon's conductivity type as the oxide's impurity diffuses into the polysilicon.

At the end of the silicon deposition, both the single crystal and polycrystalline silicon have been formed on the substrate to essentially the same thickness. The polysilicon is, however, higher than the single crystal silicon by the thickness of the oxide underlying the polysilicon.

The resulting wafer, consisting of a support substrate on which have been grown selected regions of single crystal and polycrystalline silicon, is now ready for processing to produce the active and passive elements comprising the desired integrated circuit. Each island of single crystal silicon in the wafer, which is isolated by a continuous region of polysilicon with a shape determined by the shape of the relevant portions of the oxide grid underlying the polysilicon, next has formed in it by impurity diffusion one or a plurality of active and/or passive elements. Additional doping may be added to the top-side of the polysilicon during the appropriate diffusions. During the diffusion of these elements, the impurity contained in the polysilicon diffuses out of the polysilicon into the adjacent single crystal silicon. Because the single crystal silicon has an impurity of opposite type to, but of lower concentration than, that of the impurity in the polysilicon, a PN-junction is formed in the single crystal silicon simultaneously with the diffusion of the active devices into the single crystal silicon. This PN-junction is an extremely sharp, hard PN-junction. Thus, upon the completion of the processing of the integrated circuit, a PN-junction surrounds each group of active and passive elements. This junction, when back biased, electrically isolates that group of active or passive elements from the adjacent groups of active and passive elements.

Because the width of the polysilicon between adjacent islands of single crystal silicon is essentially that of the oxide grid underlying the polysilicon, and because the lines in this oxide grid can be made as thin as masking techniques make possible, the proportion of the integrated circuit's surface area consumed by isolation regions is significantly reduced relative to the proportion consumed by prior art isolation regions. Typically, the grid lines can be made as narrow as a few microns. Thus, the polysilicon region between adjacent islands of single crystal silicon is likewise only a few microns thick.

Contact to the side of the PN-junction opposite the single crystal material is made through the polysilicon which, because of its high impurity concentration, acts essentially as a conductor.

Because the impurities in the oxide grid underlying the polycrystalline silicon not only diffuse upward into the polycrystalline silicon during the growth of the silicon, but also diffuse laterally—albeit at a much slower rate—into the single crystal silicon both during the growth of the single crystal silicon and during the diffusion of the active and passive elements into the single crystal silicon, the PN isolation junction extends in the single crystal silicon past the oxide grid to contact the substrate underlying the polycrystalline and single crystal silicon. This insures positive isolation of the active regions of the integrated circuit.

The process of this invention can also be used to contact, from the top side of the semiconductor chip, a buried collector layer underlying an active element. A region of conductivity type opposite to that of the impurity in the oxide grid is diffused into the substrate. A small region of silicon oxide containing an impurity of the same conductivity type as the impurity in the region diffused into the substrate is next formed over one end of this diffused region. The wafer is then placed in an epitaxial reactor and silicon is deposited on the top surface of the wafer as before. Single crystal silicon forms over the exposed portions of the substrate while polysilicon forms over the oxide. Upon completion of the silicon depositions, islands of single crystal silicon exist surrounded by regions of polycrystalline silicon. However, within these islands of single crystal silicon, are plugs or "pipes" of polycrystalline silicon extending from the buried collector regions underlying the single crystal silicon to the top surface of this silicon. These plugs have a resistance determined by the impurity concentration of the underlying oxide region, their length, and their cross-sectional area. By properly controlling these parameters, low resistance conductive paths to the collector regions of the transistors in the integrated circuit are formed. As in the case of the isolation grid, these collector contacting pipes may have additional doping added from their topside during, say, the normal emitter diffusion.

In a preferred embodiment of this invention, the polycrystalline and single crystal silicon are grown on the substrate from the pyrolysis of silane. At around 1040° C., the temperature at which this pyrolysis is preferably carried out, we have discovered that the ratio of the diffusion rate of boron and phosphorus in polycrystalline silicon to the diffusion rate of these impurities in single crystal silicon, is maximized.

DETAILED DESCRIPTION

Figure 1:
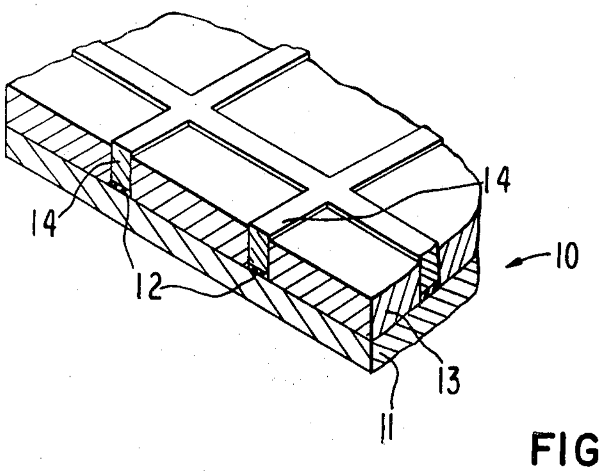
FIG. 1 shows an isometric cross-sectional view of the structure of this invention.
Figure 2A:
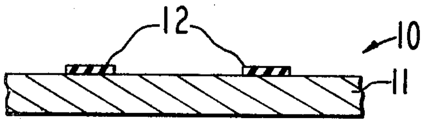
FIGS. 2*a* through 2*c* show a semiconductor wafer 10 in various stages of processing according to the method of this invention.
Figure 2B:
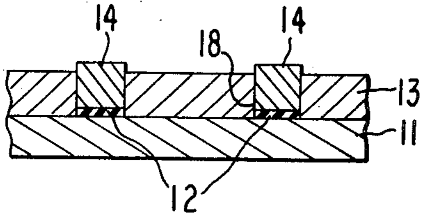
Figure 2C:
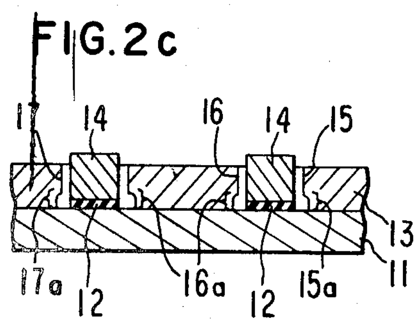

FIGS. 2*a* through 2*c* illustrate the method and structure of this invention. FIG. 1 is an isometric cross-sectional view of structure constructed according to this invention. FIG. 1 illustrates the relationship of the isolation pattern of polysilicon to the underlying oxide grid pattern.

As shown in FIG. 2*a*, substrate 11 has deposited upon it a grid 12 of silicon oxide. Silicon oxide 12 contains a selected impurity, either P-type or N-type, depending on the type of circuit to be built. A suitable impurity can be, for example, boron, phosphorus, arsenic, or any other dopant suitable for use in silicon.

Substrate 11 is preferably monocrystalline silicon doped lightly with an impurity of the same type as in oxide 12. However, this substrate can, in some cases, be any material with a crystal structure substantially similar to that of silicon, such as spinel, or sapphire.

Silicon oxide grid 12 is laid out on the top surface of substrate 11 in the pattern of the isolation regions desired in an integrated circuit semiconductor wafer. The masking and etching techniques used in obtaining silicon oxide grid 12 are well known in the semiconductor arts and thus will not be described here in detail. The silicon oxide itself, with a controlled concentration of impurity, is deposited directly on substrate 11 at a temperature well below that where any detectable diffusion takes place. After conventional photolithographic etching processes, silicon oxide in the form of the desired grid remains on substrate 11.

As discussed by M. L. Barry and P. Olofsen in an article entitled "Advances in Doped Oxides as Diffusion Sources" published in vol. II, No. 10 of Solid State Technology, pp. 39–42, October 1968, many different processes are used to grow or deposit oxide sources containing a selected dopant concentration on semiconductor substrates at low temperatures. Barry and Olofsen then discuss briefly some of these processes together with their advantages and disadvantages. This discussion will not be repeated here; rather this paper is incorporated by reference into this specification. Further work by Barry and Olofsen on oxide diffusion sources is described in a paper entitled "Doped Oxides as Diffusion Sources" published in vol. 116, No. 6 of the Journal of the Electrochemical Society, pp. 854 to 860, June 1969. This paper is likewise incorporated by reference into this specification.

The dopant concentration in silicon oxide grid 12 is selected to be higher than the initial concentration of dopants of opposite conductivity type to be placed in the single crystal silicon to be formed on top of substrate 11. Typical concentrations of dopant in silicon oxide grid 12 are $10^{20}$ impurity atoms/cm.$^3$ or greater.

Next, substrate 11 together with its overlying silicon oxide grid 12 is placed in an epitaxial reactor. Silicon is now deposited on the top surface of substrate 11 and oxide grid 12. Typically this silicon is deposited from the pyrolysis of silane. Hereafter, substrate 11 together with any overlying layers of silicon oxide, single crystal or polycrystal silicon, or other materials, will be called wafer 10.

The silicon 13 formed directly on the top surface of substrate 11 is epitaxially-grown, single crystal silicon. However, the silicon 14 formed on top of silicon oxide grid 12 is polycrystalline silicon. The deposition of silicon continues until a desired thickness of silicon has been built up on the top surface of wafer 10. A typical thickness for the deposited silicon, both polycrystalline and single crystal (FIG. 2*b*) is from 7 to 20 microns, although any desired thickness of silicon can be so formed. Because the growth rates of polycrystalline and single crystal silicon are substantially the same, the thickness of polycrystalline silicon 14 formed on silicon oxide grid 12 is equal to the thickness of single crystal silicon 13. However, polycrystalline silicon 14 extends on the average above single crystal silicon 13 by the height of oxide grid 12. This height might, for example, vary from several hundred angstroms to several microns.

During the growth of single crystal and polycrystalline silicon regions 13 and 14, a selected impurity of a conductivity type opposite to that of the impurity in oxide grid 12 is added to the silicon. If a P-type dopant is used in the oxide, then the single crystal silicon 13, and initially the polycrystalline silicon 14, are N-type silicon with an impurity concentration on the order of $10^{16}$ atoms/cm.$^3$. Because the dopant concentration in oxide 12 is about $10^{20}$ atoms/cm.$^3$ or greater and because the diffusivity of this dopant in polysilicon 14 is much higher than the diffusivity of this dopant in single crystal silicon 13, polycrystalline silicon 14 switches, due to the diffusion of the oxide dopant into the polysilicon during the growth of this polysilicon, from N-type to P-type conductivity. On the other hand, if oxide 12 and thus polycrystalline silicon 14 contains an N-type dopant, single crystal silicon 13 contains a P-type dopant in a concentration of about $10^{16}$ atoms/cm.$^3$.

The boundary 18 between polycrystalline silicon 14 and single crystal silicon 13 is sharp and is substantially perpendicular to the top surface of substrate 11. During the simultaneous growth of the polycrystalline and single crystal silicon on wafer 10, the width of polycrystalline silicon 14 remains essentially the width of the underlying oxide grid 12 with, however, a slight outward flaring of the polycrystalline silicon with height. Experimental observations indicate that for a 7 micron high polycrystalline silicon layer, the width of the top exposed portion of the polycrystalline silicon is about 3 microns greater than the width of the bottom portion of the polycrystalline silicon independent of the original width of the oxide grid underlying the polycrystalline silicon.

Techniques for the epitaxial growth of silicon are well known.

During the growth of the polycrystalline and single crystal silicon, which progresses typically at the rate of 0.3 to one (1)$\mu$/min. for a reactor temperature of 1040° C., the dopant contained in oxide grid 12 moves upward into the newly grown polycrystalline silicon. This dopant also moves laterally into the adjacent newly grown single crystal silicon, but because the diffusivity of a given dopant in polycrystalline silicon is much greater than the diffusivity of the same dopant in single crystal silicon, most of the dopant travels into the polycrystalline silicon.

Figure 6A:
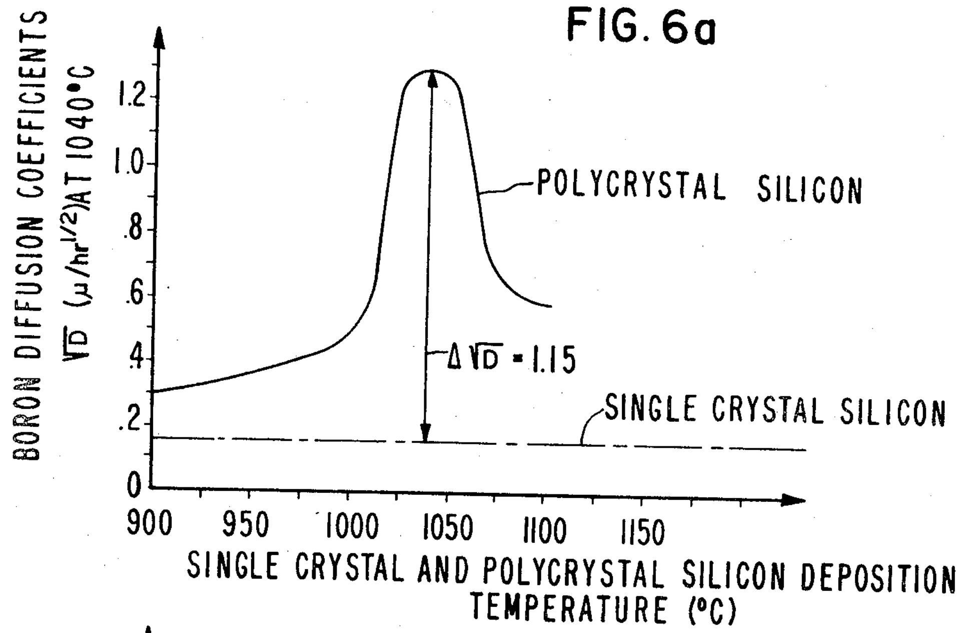
FIGS. 6*a* and 6*b* show diffusion rates of various impurities in both polycrystalline silicon and single crystal silicon.

FIG. 6*a* shows the diffusion coefficients of boron, a P-type dopant, from a silicon oxide into both polycrystalline silicon and single crystal silicon, as a function of the silicon deposition temperature. The diffusion coefficients are expressed as $\sqrt{D}$, where D is the diffusivity. D is defined, for example, in chapter 3 of A. S. Grove's book "Physics and Technology of Semiconductor Devices" published by John Wiley & Sons, Inc., 1967. The diffusivity D has units of distance $^2$/unit time. Because the diffusion rate is proportional to the square root of D, and because diffusion rate is the parameter which gives diffusion distance as a function of time, the ordinate of FIG. 6*a* represents the $\sqrt{D}$. The abscissa of FIG. 6*a* is the temperature at which the single crystal and polycrystalline silicon were deposited on substrate 11.

FIG. 6*a* shows that the diffusion rate of boron in single crystal silicon is independent of the deposition temperature of single crystal silicon. This is shown by the horizontal line intersecting the ordinate at a value of $\sqrt{D}$ of 0.15. On the other hand, boron diffuses into polycrystalline silicon at a rate strongly dependent on the temperature at which the polycrystalline silicon was deposited. FIG. 6*a* shows that the diffusion rate of boron is a maximum at a deposition temperature of approximately 1040° C. or thereabouts. At this deposition temperature, the difference between the diffusion rates of boron in polycrystalline silicon and single crystal silicon is maximized. It is one feature of this invention that the growth of the polycrystalline and single crystal silicon on substrate 11 takes place from the pyrolysis of silane at approximately 1040° C. Thus during the deposition of polycrystalline and single crystal silicon on substrate 11, the dopant contained in oxide grid 12 (FIGS. 1 and 2*a*, 2*b* and 2*c*) diffuses into the polycrystalline silicon 14 at a rate which has been maximized relative to the diffusion of this dopant into the adjacent single crystal silicon. FIG. 6*a* shows that the range of deposition temperatures to either side of 1040° C. over which this diffusion rate difference is substantially maximized, is quite small, occupying a range of perhaps plus or minus 10 to 15° C. Furthermore, experimental work indicates that as the diffusion temperature increases, the difference between the diffusion rates of boron into polycrystalline silicon and of boron into single crystal siilcon decreases. It should be noted that although the concentration of boron in oxide grid 12 is about 2% by weight, $\sqrt{D}$ is substantially independent of the boron concentration in the oxide, so the graph shown in FIG. 6*a* holds for other concentrations of boron in oxide as well.

Figure 6B:
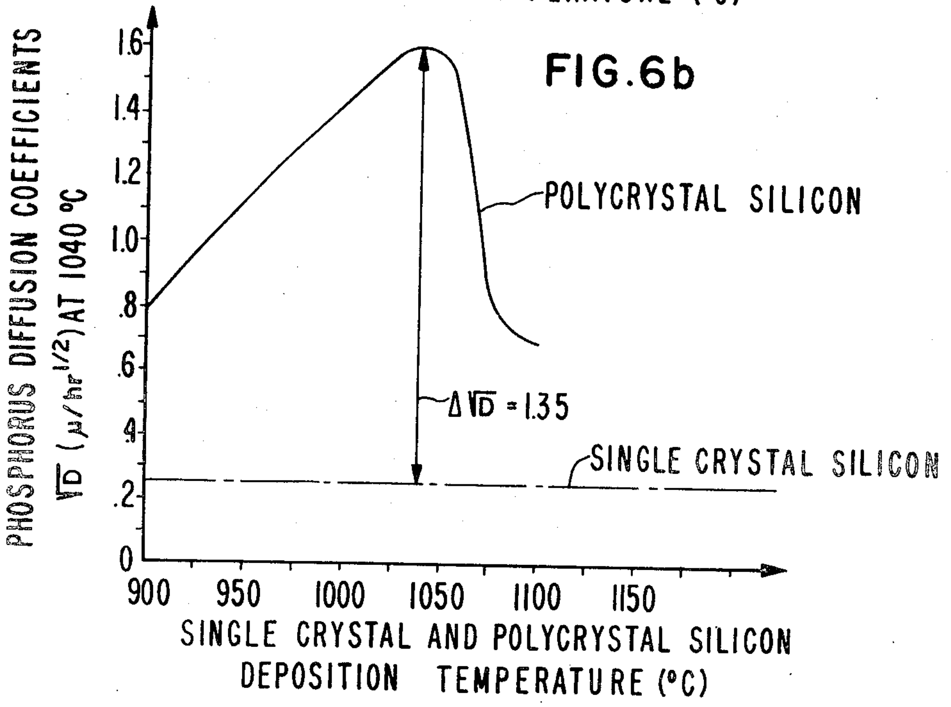

FIG. 6*b* shows the diffusion coefficients of phosphorus, an N-type dopant, from a silicon oxide into both polycrystalline and single crystal silicon as a function of the silicon deposition temperature. Again the diffusion coefficient is expressed as $\sqrt{D}$, with units of length per unit time to the ½ power. These diffusion coefficients are measured at 1040° C. And again, the diffusion rate of phosphorus in polycrystalline silicon varies drastically with the deposition temperature of the polycrystalline silicon, while the diffusion rate of phosphorus in single crystal silicon is constant as a function of the deposition temperature of the single crystal silicon. The maximum difference in diffusion rates of about 1.35 microns per hour to the ½ power, occurs at a silicon deposition temperature of 1040° C., the optimum temperature for depositing silicon from the pyrolysis of silane. And as shown in FIG. 6*b*, the difference between the diffusion rates of phosphorus in polycrystalline silicon and in single crystal silicon again drops off drastically as the deposition temperature either increases or decreases from 1040° C.

The diffusion coefficients shown in FIG. 6*b* reflect the diffusion of phosphorus from silicon oxide into either polycrystalline or single crystal silicon. The concentration of phosphorus in the oxide is 5% by weight but again, the diffusion coefficient does not vary significantly with small changes in the phosphorus concentration in the oxide from this percentage.

It is apparent from both FIGS. 6*a* and 6*b*, that the diffusion rates of both boron and phosphorus from silicon oxide into adjacent polycrystalline silicon are much larger than the diffusion rates of these impurities from silicon oxide into adjacent single crystal silicon. It is also apparent that the maximum difference in these diffusion rates occurs at a deposition temperature of about 1040° C., the temperature at which silicon regions 13 and 14 are grown on top of substrate 11 and oxide 12 from pyrolysis of silane. Thus during the growth of polycrystalline silicon region 14 and single crystal silicon region 13, an impurity contained in the underlying oxide grid 12 diffuses mainly into the overlying polycrystalline silicon 14.

The wafer 10 shown in FIG. 2*b* is now ready for the formation of the active and passive semiconductor elements in each of the islands of single crystal silicon material 13 surrounded by polycrystalline silicon material 14. During the formation of these elements by well-known techniques such as the planar process described in U.S. Pats. Nos. 3,025,589 and 3,064,167, both assigned to the assignee of this invention, the dopant contained in polycrystalline silicon region 14 continues to diffuse vertically in this silicon as well as laterally out of the silicon 14 and into the adjacent regions of single crystal silicon 13. This diffusion occurs at essentially the same rate as the diffusion of P or N-type impurities into the single crystal silicon to form the active and passive semiconductor elements.

During the diffusion into a selected island or islands of single crystal silicon 13, of an impurity of type opposite to that of the impurity in single crystal silicon regions 13 to form the base regions of transistors, the impurity contained in the polycrystalline silicon 14 diffuses laterally at the same rate into the adjacent single crystal silicon. Next, during the diffusion of an impurity to form an emitter region into each previously diffused base region, the impurity from polysilicon 14 continues its lateral movement into single crystal silicon 13. Upon completion of the formation of active and/or passive elements in single crystal silicon material 13, the impurity contained within polycrystalline silicon 14 has migrated into the adjacent single crystal silicon 13 to form PN junctions 15, 16 and 17, as shown in FIG. 2*c*. For simplicity, the active devices commonly formed in single crystal silicon 13 are not shown in FIG. 2*c*.

PN-junctions 15, 16 and 17 are sharply defined junctions approximately perpendicular, on the average, to the top surface of substrate 11. These junctions stand on the order of the same distance from the boundary 18 (FIG. 2*b*) of polycrystalline silicon 14 and single crystal silicon 13 as the base of a transistor diffused in silicon 13 is deep. As a result, if oxide grid 12 is 5 microns wide, and the transistor base-collector junction is a few microns from the top surface of silicon 13, the isolation region formed by the diffusant moving out of polycrystalline silicon into adjacent single crystal silicon 13 is at most 14 or 15 microns wide. This is a considerable reduction in the width of an isolation region when compared to the widths of diffused isolation regions formed by diffusing an impurity from the top of the single crystal silicon 13 down to substrate 11.

Figure 3:
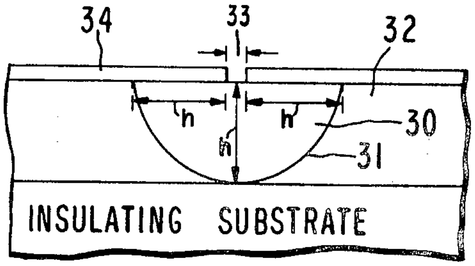
FIG. 3 (PRIOR ART)
FIG. 3 shows in cross-sectional view, a typical diffused isolation region of the prior art.

Such a prior art diffused isolation region is illustrated in FIG. 3. To insure contact of isolation region 30 with the underlying substrate, the width of this isolation region must be at least twice the thickness of the epitaxially grown silicon 32 plus the width of the window 33 in oxide layer 34 through which the diffusant is passed. Typical widths for isolation region 30, to insure positive contact with the underlying substrate 35 vary from 20 microns on up to 50 microns and above. Isolation region 30 is of opposite conductivity type to epitaxially grown silicon 32 and is electrically isolated from silicon 32 by backbiasing PN junction 31.

During the growth of polysilicon regions 14 and single crystal silicon regions 13, the impurity contained within oxide grid 12 diffuses not only into the polycrystalline silicon region 14 but also laterally into the adjacent single crystal silicon regions 13. Although the diffusion rate of this impurity into the single crystal silicon regions 13 is, as discussed above, significantly lower than the diffusion rate of this impurity into the overlying polycrystalline silicon regions 14, the lateral diffusion of the impurity from oxide 12 into the adjacent single crystal silicon 13 insures that regions 15*a*, 16*a*, and 17*a* of these junctions positively contact underlying substrate 11. In some embodiments, this substrate 11 will likewise be doped with an impurity of the same conductivity type as the impurity contained within oxide 12. Thus, each island of single crystal silicon 13 surrounded by polycrystalline silicon 14 and underlying substrate 11, will effectively be isolated from adjacent islands of single crystal silicon material 13 when the PN junctions between the single crystal silicon 13 on the one hand, and the polycrystalline silicon 14 and, in some cases, substrate 11 on the other hand, are back biased.

Figure 4A:
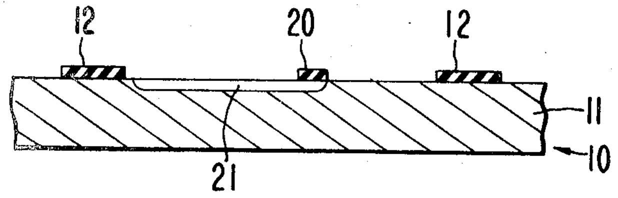
FIGS. 4*a* through 4*c* illustrate a second embodiment of this invention.
Figure 4B:
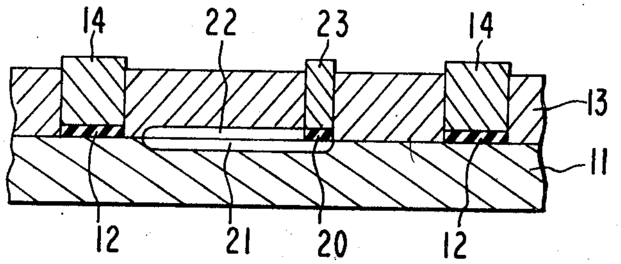
Figure 4C:
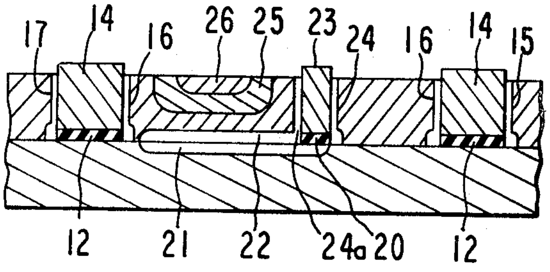

FIGS. 4*a* through 4*c* illustrate a second embodiment of this invention. Components of these figures identical to corresponding components shown in FIGS. 2*a* through 2*c* are numbered identically. In FIG. 4*a*, substrate 11, which might, for example, be of single crystal silicon, has formed on it a grid 12 of silicon oxide. Then region 21 is formed in substrate 11 by diffusing a selected dopant, of conductivity type opposite to that of the dopant contained in silicon oxide grid 12, into and through the top surface of substrate 11 to a selected depth. If silicon oxide grid 12 contains a P-type impurity such as boron, then region 21 is formed using an N-type impurity such as antimony or arsenic. Region 21 can be any desired shape. The impurity concentration in region 21 is approximately $10^{18}$ atoms/cm.$^3$, while the impurity concentration in silicon oxide grid 12 is on the order of $10^{21}$ impurity atoms/cm.$^3$.

A small region of silicon oxide 20, doped however, with an impurity of the same conductivity type as the impurity in region 21 is next formed over one edge of region 21. Silicon oxide region 20 may be doped with phosphorus, arsenic, antimony or any other N-type impurity if an N-type impurity is desired in this region.

Next, wafer 10 is placed in an epitaxial reactor and silicon is deposited over the top surface of wafer 10 to a selected thickness. Again, as with the structure shown in FIGS. 2*a* through 2*c*, single crystal silicon 13 forms directly over the surface of substrate 11, while polycrystalline silicon 14 and 23 forms over silicon oxide grid 12 and silicon oxide region 20. During the growth of the single crystal and polycrystalline silicon regions, the dopant contained in region 21 diffuses somewhat into the overlying single crystal silicon region 13 to form, as shown in FIG. 4*b*, region 22. Simultaneously, the dopants contained in silicon oxide grid 12 and silicon oxide region 20, typically boron, and phosphorus, respectively, diffuse rapidly into the newly grown, overlying polysilicon regions 14 and 23 respectively.

Upon completion of the growth of the single crystal and polycrystalline silicon, wafer 10 appears in cross-section as shown in FIG. 4*b*. Again, single crystal region 13 and polycrystalline regions 14 and 23 are approximately the same thickness, the polycrystal regions extending, on the average, above the single crystal regions by the thickness of the underlying silicon oxide regions 12 and 20. Polycrystalline region 14 however, is doped with an impurity of opposite conductivity type to the impurity used to dope polysilicon region 23.

Active and/or passive devices are now formed in each island of single crystal silicon 13. A small segment of a typical structure, shown schematically in FIG. 4*c*, consists of an active element containing typically an emitter 26 of the same conductivity type as single crystal silicon region 13 but with a higher impurity concentration, diffused into a base region 25 of the same conductivity type as polysilicon region 14. The impurity concentration of base region 25 is, of course, less than the impurity concentration of emitter region 26.

The collector of the transistor is formed from the adjacent single crystal silicon material 13. Contact to this collector region is made through an underlying buried layer consisting of regions 22 and 21 of the same conductivity type as single crystal silicon 13 only more heavily doped to an impurity concentration of approximately $10^{18}$ atoms/cm.$^3$. Contact from the top surface of wafer 10 to this buried layer in turn is made through the small plug or pipe of polycrystalline silicon 23 formed on top of silicon oxide region 20. Polycrystalline silicon region 23 provides an extremely low resistance path to buried layer regions 22 and 21. By controlling the cross-sectional area of polycrystalline silicon region 23, as well as its impurity concentration, the resistance of this path can be controlled.

It should be noted that silicon oxide region 20 does not interfere with the conductive path from polycrystalline region 23 to buried layers 22 and 21.

Rather, because the impurity contained in polycrystalline silicon region 23 and silicon oxide 20 has diffused into adjacent regions of single crystal silicon 13 during the diffusion of base 25 and emitter 26 in the single crystal silicon 13, a conductive path is formed in region **24*a* around silicon oxide 20**.

Figure 5:
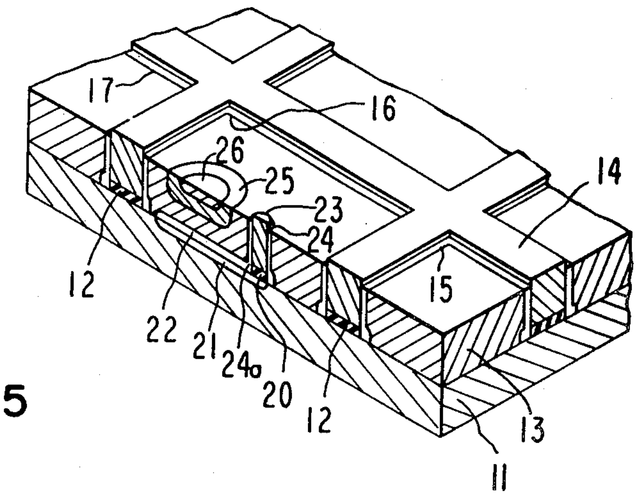
FIG. 5 shows an isometric cross-sectional view of the structure shown in FIG. 4*c*.

FIG. 5 shows an isometric cross-sectional view of the structure shown in FIG. 4*c*. This view shows that polysilicon isolation and plug regions 14 and 23 follow quite faithfully the oxide grid lines 12 and silicon oxide region 20 respectively placed on the top surface of substrate 11. Because the silicon oxide grid lines 12 can be made, for example, as little as 2 microns wide and perhaps even narrower, the polycrystalline silicon isolation region on the top surface of wafer 10 is only a few microns more than 2 microns wide, at most. Consequently, the width of such isolation regions relative to the width of comparable isolation regions in prior art devices has been reduced on the order of one magnitude. The consequent saving in wafer surface area results in much more efficient use of semiconductor material and lower production costs for devices.

The following examples illustrate the processes followed to obtain the structures of this invention.

EXAMPLE I

This example describes the preparation of a wafer in which can be formed NPN devices.

A boron doped silicon oxide grid 12 was deposited to a thickness of about 1500 angstroms on substrate 11 by the oxidation of silane ($SiH_4$) and diborane ($B_2H_6$) gases in a nozzle reactor. The substrate, single crystal silicon doped with boron, a P-type impurity, to an impurity concentration of about $10^{15}$ atoms cm.$^3$, was at a temperature of 400° C. The silane flow rate was 12 cc./minute; the diborane flow rate was 1.2 cc./minute. In addition, 75 cc./minute of oxygen, 112 cc./minute of argon and 2.2 liters/minute of nitrogen flowed through the reactor.

This boron-doped silicon oxide was masked and etched using well-known solution of ammonium fluoride and hydrofluoric acid. Etching terminated when the desired boron doped silicon oxide isolation grid pattern was obtained on the substrate 11.

The wafer 10 containing oxide grid 12 was carefully rinsed and cleaned using techniques well known in the semiconductor arts. Then silicon was deposited from the pyrolysis of silane ($SiH_4$) with an N-type dopant incorporated into the film during deposition. For this deposition, substrate 11 was heated in a horizontal RF reactor to 1040° C. Hydrogen flowed through the reactor chamber at a rate of 68 liters per minute and a pressure of 1 atmosphere. Reactant gases were introduced into the carrier gas stream to give it the desired growth rate and resistivity. For a 0.5 ohm-cm. single crystal silicon film, arsine ($AsH_3$) was added at a partial pressure of about $4.6 \times 10^{-9}$ atmospheres. A silane concentration of 0.185 mole percent gave a deposition rate of 0.45 micron per minute. The silicon deposited over the exposed surface of substrate 11 was single crystal silicon, while the silicon 14 deposited over oxide grid 12 was polycrystalline silicon. Silicon deposition continued for about 15 minutes to yield a silicon film on substrate 11 about 7 microns thick. This silicon film consisted of regions of single crystal silicon 13 isolated by a grid of polycrystalline silicon 14.

Conventional oxidation masking and diffusion techniques were then employed to fabricate the active and passive elements of an integrated circuit. No separate isolation mask diffusion was performed. However, it should be noted that the isolation grid of polycrystalline silicon 14 may, if desired, be exposed or "opened," and dopants diffused into this grid from the top along with the bases of the transistors formed in single crystal silicon 13.

EXAMPLE II

This example describes the preparation of a wafer suitable for use with PNP devices.

Phosphorus doped silicon oxide was deposited to a thickness of about 1500 angstroms on substrate 11 by the oxidation of silane ($SiH_4$) and phosphine ($PH_3$) gases in a nozzle reactor. The substrate, doped with N-type impurities to a concentration on the order of $10^{15}$ atoms/cm.$^3$ was held at 400° C. The silane flow rate was 10 cc./minute, and the phosphine flow rate 0.2 cc./minute. In addition, oxygen at 50 cc./minute, argon at 97 cc./minute and nitrogen at 2.2 liters/minute, flowed through the reactor. The phosphorus doped silicon oxide was masked and etched using well-known photolithographic techniques together with an ammonium-fluoride hydrofluoric acid etching solution. This left phosphorus-doped silicon oxide grid 12 on the top surface of substrate 11 in the desired grid pattern.

Next, a layer of silicon was deposited on the top surface of substrate 11 and grid 12. This deposition process was identical with the same step in Example I except that diborane ($B_2H_6$) was used as the dopant gas to ensure that single crystal silicon region 13 was P-type rather than an N-type as in Example I. The reactor temperatures and flow rates were the same as in Example I so far as the silane and carrier gas were concerned. The diborane partial pressure was on the order of $10^{-8}$ to $10^{-10}$ atmospheres depending upon the resistivity desired in the single crystal silicon region 13.

Again, conventional oxidation masking and diffusion operations were employed for fabricating the active and passive elements of the integrated circuits. And again, no separate isolation mask diffusion was performed as isolation of active regions was obtained by back-biasing the PN junction formed between polycrystalline silicon region 14 and single crystal silicon region 13.

It should be noted that if desired, impurities may be diffused into the polycrystalline silicon region 14 from the top of this polycrystalline silicon along with the diffusion of the bases of active devices, such as bipolar transistors.

EXAMPLE III

In this example, an integrated circuit is described, which, in addition to containing polycrystalline silicon isolation walls, contains polycrystalline silicon plugs extending from the top surface of the single crystal silicon 13 to a buried collector layer 21, 22 underlying the single crystal silicon region 13.

Again, silicon oxide, containing a selected concentration of boron, a P-type impurity, was deposited to a thickness of 1500 angstroms on a substrate 11 by the oxidation of silane ($SiH_4$) and diborane ($B_2H_6$) gases in a nozzle reactor. The substrate was held at 400° C. The silane flow was 12 cc./minute, the diborane flow rate was 1.22 cc./minute, the oxygen flow rate was 75 cc./minute, the argon flow rate 112 cc./minute, and the nitrogen flow rate was 2.2 liters/minute. The boron-doped silicon oxide layer was masked and etched using well-known photolithographic techniques. The etchant again was an ammonium-fluoride hydrofluoric acid etching solution. The result was a boron-doped silicon oxide isolation grid pattern 12 on substrate 11.

Next, a phosphorus-doped silicon oxide layer was deposited to a thickness of 1500 angstroms on a substrate 11 by the oxidation of silane and phosphine ($PH_3$) gases in a nozzle reactor. The substrate temperature again was 400° C. The silane flow rate was 10 cc./minute, the phosphine flow rate was 0.2 cc./minute, the oxygen flow rate was 50 cc./minute, the argon flow rate was 97 cc./minute, and the nitrogen flow rate was 2.2 liters/minute. This phosphorus-doped silicon oxide was next masked and etched using well-known photolithographic techniques, to leave phosphorus-doped silicon oxide region 20 on substrate 11. The etchant again was an ammonium fluoride-hydrofluoric acid etching solution. Silicon oxide region 20 is shaped in the pattern desired for the cross-sectional area of the polysilicon pipe 23 used to contact, from the top side of wafer 10, the collector region 13 of the transistor shown in FIGS. 4c and 5. Some care must be taken however, during the etching of the phosphorus-doped silicon oxide layer not to remove the underlying boron-doped silicon oxide isolation grid pattern which underlies the phosphorus-doped silicon oxide. Fortunately, phosphorus-doped oxide etches away more rapidly than boron-doped oxide. Nevertheless, care must be taken to carefully monitor the total time wafer 10 is etched to prevent the undesired removal of oxide grid pattern 12.

Next, as in Examples I and II, silicon is deposited over oxide grid pattern 12 and oxide pattern 20 to a selected thickness by the pyrolysis of silane with an N-type dopant. This pyrolysis again occurs in a horizontal RF heated reactor at a temperature of 1040° C. The parameters of the reactor and the flow rate are as given above in Example I.

The diffusion of active devices again occurs as in Example I. Now, however, contact to the collector region of any diffused transistor is made through polycrystalline silicon plug 23 to an underlying buried collector region.

Conclusion

It should be noted that FIGS. 1 through 5 show schematically only a small portion of a much larger structure. These figures are not drawn to scale and do not show any of the insulation, passivation or metallization layers commonly used with integrated circuits. While only one diffused transistor is shown in single crystal silicon 13, a wide variety of devices, both active and passive, can, of course, be diffused into the semiconductor wafers of this invention.

Furthermore, the term "conductivity type" when used in the specification and claims to characterize an impurity, refers to the conductivity type of semiconductor material containing predominantly this impurity.

What is clamied is:

1. The method of forming a wafer of material suitable for use in producing integrated circuits, which comprises:
   forming a grid of silicon oxide on a selected surface of a substrate selected from a group of materials consisting of sapphire, spinel and silicon semiconductor material, said silicon oxide containing a selected concentration of an impurity which is of one conductivity type in said silicon semiconductor material; and
   forming silicon semiconductor material containing an impurity of opposite conductivity type to a selected thickness over the surfaces of said substrate and said grid, single crystal silicon being formed over said substrate, and polycrystalline silicon being formed over said silicon oxide, part of said impurity in said grid diffusing from said grid into said polycrystalline silicon and adjacent portions of said single crystal silicon, thereby to convert the conductivity type of said polycrystalline silicon and said adjacent single crystal silicon to said opposite conductivity type.

2. The method of claim 1 wherein said one conductivity type is P-type, while said opposite conductivity type is N-type.

3. The method of claim 2 wherein said step of forming a grid of silicon oxide comprises
   depositing to a selected thickness a layer of boron-doped silicon oxide on said substrate by the oxidation of silane and diborane gases;
   masking said silicon oxide layer; and
   etching said masked silicon oxide layer to remove all said silicon oxide layer except the desired boron-doped silicon oxide grid from the surface of said substrate.

4. The method of claim 3 wherein said single crystal and polycrystalline silicon is deposited on said substrate from the pyrolysis of silane and a gas containing an N-type dopant in an RF reactor.

5. The method of claim 4 wherein said gas containing an N-type dopant is arsine and said pyrolysis of silane and arsine is carried out at approximately 1040° C.

6. The method of claim 1 wherein said one conductivity type is N-type, while said opposite conductivity type is P-type.

7. The method of claim 6 wherein said step of forming a grid of silicon oxide comprises
   depositing a layer of phosphorus-doped silicon oxide to a selected thickness on said substrate by the oxidation of silane and phosphine gases;
   masking said silicon oxide layer; and
   etching said masked silicon oxide layer to remove all said silicon oxide layer except said grid of phosphorus-doped silicon oxide on said silicon substrate.

8. The method of claim 7 wherein said single crystal and polycrystalline silicon is deposited on said substrate from the pyrolysis of silane and a gas containing a P-type dopant in an RF reactor.

9. The method of claim 8 wherein said gas containing a P-type dopant is diborane and said pyrolysis of silane and diborane is carried out at approximately 1040° C.

10. The method of claim 1 wherein said substrate is of an insulating material selected from the group of materials consisting of sapphire and spinel.

11. The method of claim 1 wherein the step of forming semiconductor material to a selected thickness over the surfaces of said substrate and grid comprises
   forming a layer of silicon from the pyrolysis of silane at a temperature in the range from 1025° C. to 1055° C.

12. The method of claim 1 wherein said substrate is of silicon semiconductor material.

References Cited

UNITED STATES PATENTS

| | | | |
|---|---|---|---|
| 3,391,035 | 7/1968 | Mackintosh | 148—187 |
| 3,393,349 | 7/1968 | Huffman | 317—101 |
| 3,475,661 | 10/1969 | Iwata et al. | 317—234 |
| 3,562,032 | 2/1971 | Frovin et al. | 148—175 |
| 3,617,826 | 11/1971 | Kobayashi | 317—235 |
| 3,617,822 | 11/1971 | Kobayashi | 317—235 R |
| 3,671,338 | 6/1972 | Fujii | 148—175 |

OTHER REFERENCES

Kabaya et al. "Quick Curtain" Electronics, Sept. 30, 1968, p. 209.

Sony Corp., "Monolithic IC Puts Out 18 Watts" Electronics, Mar. 17, 1969, pp. 185–186.

L. DEWAYNE RUTLEDGE, Primary Examiner

W. G. SABA, Assistant Examiner

U.S. Cl. X.R.

29—576, 580; 117—201, 212, 213; 148—174, 187, 191; 317—235 R

UNITED STATES PATENT OFFICE
CERTIFICATE OF CORRECTION

Patent No. 3,736,193 Dated May 29, 1973

Inventor(s) Ross N. Tucker et al.

It is certified that error appears in the above-identified patent and that said Letters Patent are hereby corrected as shown below:

Claim 1, last line, "opposite" should read -- one --.

Signed and sealed this 4th day of June 1974.

(SEAL)
Attest:

EDWARD M.FLETCHER,JR.
Attesting Officer

C. MARSHALL DANN
Commissioner of Patents